12/10/85 OR 4,558,249

United States Patent [19]

Lerch et al.

[11] Patent Number: 4,558,249

[45] Date of Patent: Dec. 10, 1985

[54] STRETCHED PIEZOPOLYMER TRANSDUCER WITH UNSUPPORTED AREAS

[76] Inventors: Reinhard Lerch, Hochstrasse 6, D-6420 Lauterbach; Gerhard M. Sessler, Fichtestrasse 30 B, 6100 Darmstadt, both of Fed. Rep. of Germany

[21] Appl. No.: 587,840

[22] Filed: Mar. 12, 1984

Related U.S. Application Data

[63] Continuation of Ser. No. 241,428, Mar. 6, 1981, abandoned.

[30] Foreign Application Priority Data

Mar. 10, 1980 [DE] Fed. Rep. of Germany ....... 3009068

[51] Int. Cl.[4] ........................................ H01L 41/08

[52] U.S. Cl. .................................... 310/322; 310/324; 310/800; 179/110 A

[58] Field of Search ........................ 310/800, 322, 324; 179/110 A

[56] References Cited

U.S. PATENT DOCUMENTS

| | | | |
|---|---|---|---|
| 3,832,580 | 8/1974 | Yamamuro | 179/110 A |
| 4,056,742 | 11/1977 | Tibbetts | 179/110 A |
| 4,156,800 | 5/1979 | Sear et al. | 310/800 |
| 4,186,323 | 1/1980 | Cragg et al. | 310/800 X |
| 4,440,983 | 4/1984 | Facoetti et al. | 310/800 X |

FOREIGN PATENT DOCUMENTS

| | | | |
|---|---|---|---|
| 52-45921 | 12/1977 | Japan | 179/110 A |
| 6801923 | 8/1969 | Netherlands | 179/110 A |

*Primary Examiner*—Mark O. Budd
*Attorney, Agent, or Firm*—Toren, McGeady, Stanger

[57] ABSTRACT

In the disclosed transducer, a frame supports the edges of a piezopolymer sheet coated on both faces with electrodes, while a holding structure supports an area but leaves a larger area of the central portion of the sheet unsupported. According to preferred embodiments, the frame stretches the sheet, in the form of a membrane, across one or more contact areas on the holding structure, and the contact area approximates a point located near the center of the sheet or a number of concentric annuli. Preferably, the structure forms one terminal contacting one electrode and the frame forms another terminal contacting the other electrode.

20 Claims, 4 Drawing Figures

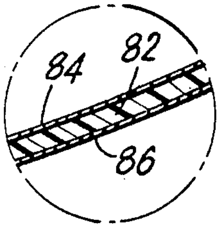
FIG. 3A
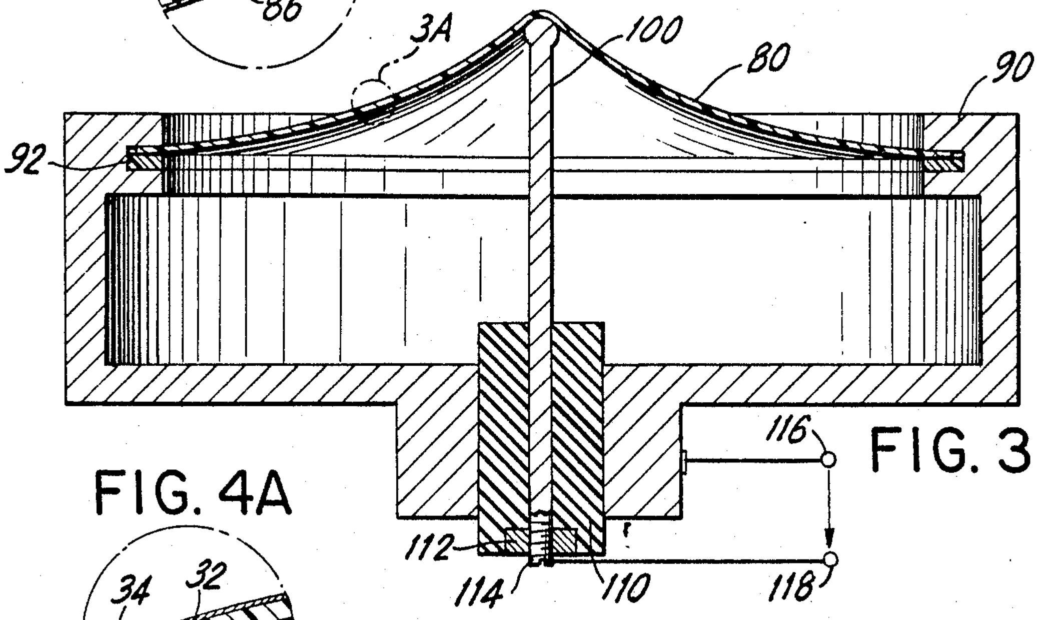
FIG. 3
FIG. 4A
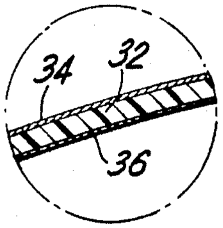
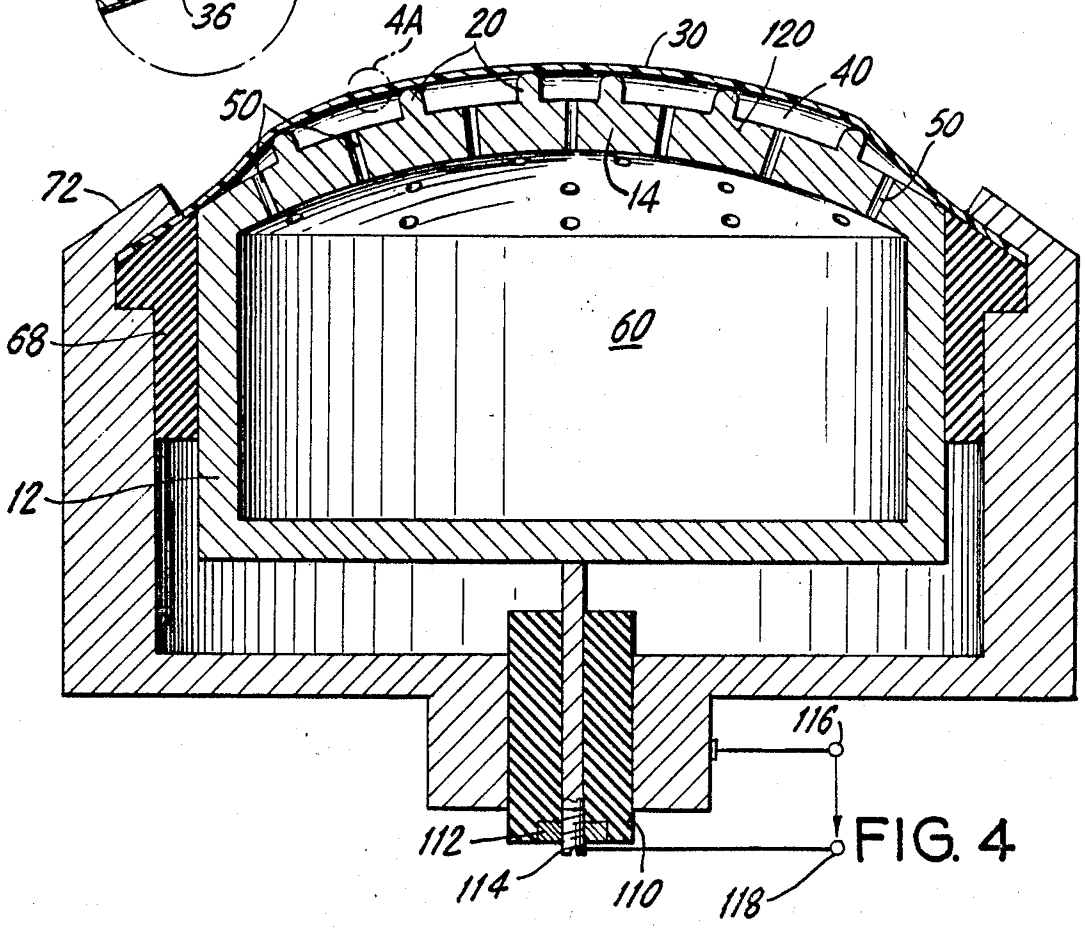
FIG. 4

STRETCHED PIEZOPOLYMER TRANSDUCER WITH UNSUPPORTED AREAS

This application is a continuation, of application Ser. No. 241,428, filed 3-6-81, now abandoned.

BACKGROUND OF THE INVENTION

This invention relates to transducers, and particularly to electroacoustic, acoustoelectric, electromechanic, and mechanoelectric piezopolymer transducers, such as microphones, earphones, and loudspeakers for use in telephony and electrical communications, in broadcast, television and home recording applications, and other fields.

Piezopolymer transducers generally utilize a polymer-membrane sheet such as polyvinylidenefluoride composed of chain molecules with repeat units of $CF_2CH_2$ referred to as PVDF or $PVF_2$, polyvinylfluoride, polyvinylchloride, etc., as the piezoelectric material. Each face of the membrane or sheet is metallized for the application of potentials thereacross. In common with other piezoelectric devices, an electric field created by potentials across the electrodes formed by the metallization on the membrane surfaces produce distortions or other changes in the shape of the membrane material. Conversely, changing the shape of the membrane material produces an electric field detectable by connection to the electrodes.

Piezopolymer transducers constructed on the basis of the Bender principle are composed of a metallized polymer film of the type mentioned which is then curved and clamped at the edge. The purpose of the curvature is to achieve a desired linearity of transduction and proper matching between the transducer and the surrounding medium, e.g., air. Two methods of achieving the necessary curvature of the membrane have been suggested. One of these involves stretching the piezopolymer membrane over a spherical or other convex piece of foam rubber. This is described by M. Tamura, et al., in "Electroacoustic Transducers With Piezoelectric Films", in the journal of the Audio Engineering Society, Volume 23, page 21, (1975). According to another suggestion, the piezopolymer membranes were self-supported and achieved the advantage of higher sensitivity, particularly at lower temperatures. This is disclosed by R. Lerch in the article "Electroacoustic Transducers Using Piezoelectric Polyvinylidenefluoride Films" in J. Acoust. Soc. Am 66, 952 (1979). However, such transducers have a number of disadvantages.

The expected production tolerances and variations with foam rubber backings or with self-supported membranes are sufficiently high to significantly affect the membrane geometry. On the other hand, the membrane geometry substantially influences the sensitivity of such transducers. As a result, it is difficult to reproduce sensitivities, i.e., conversion factors, among transducers. Also, long term exposure to heat and other conditions may create undesired geometric deformations of the membrane and result in change of conversion factor over the age of a single transducer.

Therefore, piezopolymer transducers with foam rubber backing or self-supported transducers of this type exhibit lack of uniformity in production from the inherently large production tolerances or suffer from relatively poor long term stability. In addition, disadvantageous frequency shifts of resonances occur with devices of this type.

An object of the present invention is to eliminate the aforementioned drawbacks of such piezopolymer transducers.

Another object of the invention is to achieve better than hitherto available transduction from mechanical to electrical signals and vice versa with piezopolymer transducers.

SUMMARY OF THE INVENTION

According to a feature of the invention, these objects are achieved in whole or in part by supporting the edges of a piezopolymer sheet coated on both faces with electrodes by means of a frame, while a holding structure supports less than a major portion of the interior of the sheet. The elastic properties of the sheet and the support points then define the curvature of the sheet.

According to another feature of the invention, the holding structure is rigid.

According to another feature of the invention, the frame stretches the sheet across one or more contact areas on the holding structure.

According to another feature, the contact area approximates a point located near the center of the sheet.

According to yet another embodiment of the invention, the contact area is formed by ridges on a number of concentric annuli.

According to another feature of the invention, the structure forms one terminal by virtue of its electrical contact with one electrode on the face of the sheet and the frame forms another terminal by contacting the other electrode.

According to another aspect of the invention, these objects are achieved by making the sheet in the form of a membrane and supporting or mounting the lower face of the electrodized piezoelectric polymer membrane at one or several points along lines or areas as well as along the edge to reduce properly curved membrane surfaces with rigid supports. The curvature is then achieved in part by the points, lines, or areas of support and in part by the elastic properties of the membrane.

According to one embodiment of the invention, a circular membrane is clamped at its edge and a single support "point" (an area approximating a point) results in deforming the membrane, not into the shape of a cone but rather to that of a tent. Such a membrane area yields linear transduction. Other suitable support geometries also yield the desired membrane curvatures.

These and other features of the invention are pointed out in the claims forming a part of this specification. Other objects and advantages of the invention will become evident from the following detailed description when read in light of the accompanying drawings.

BRIEF DESCRIPTION OF THE DRAWINGS

FIG. 3 and 3*a* show a cross-sectional view of another transducer embodying features of the invention.

FIG. 4 and 4*a* show a cross-section of yet another transducer embodying features of the invention.

DESCRIPTION OF PREFERRED EMBODIMENTS

Figure 1A:
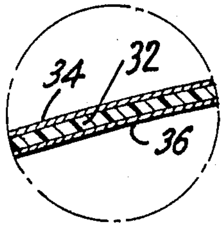
FIG. 1 and 1*a* show a cross-section of a transducer embodying features of the present invention.
Figure 1:
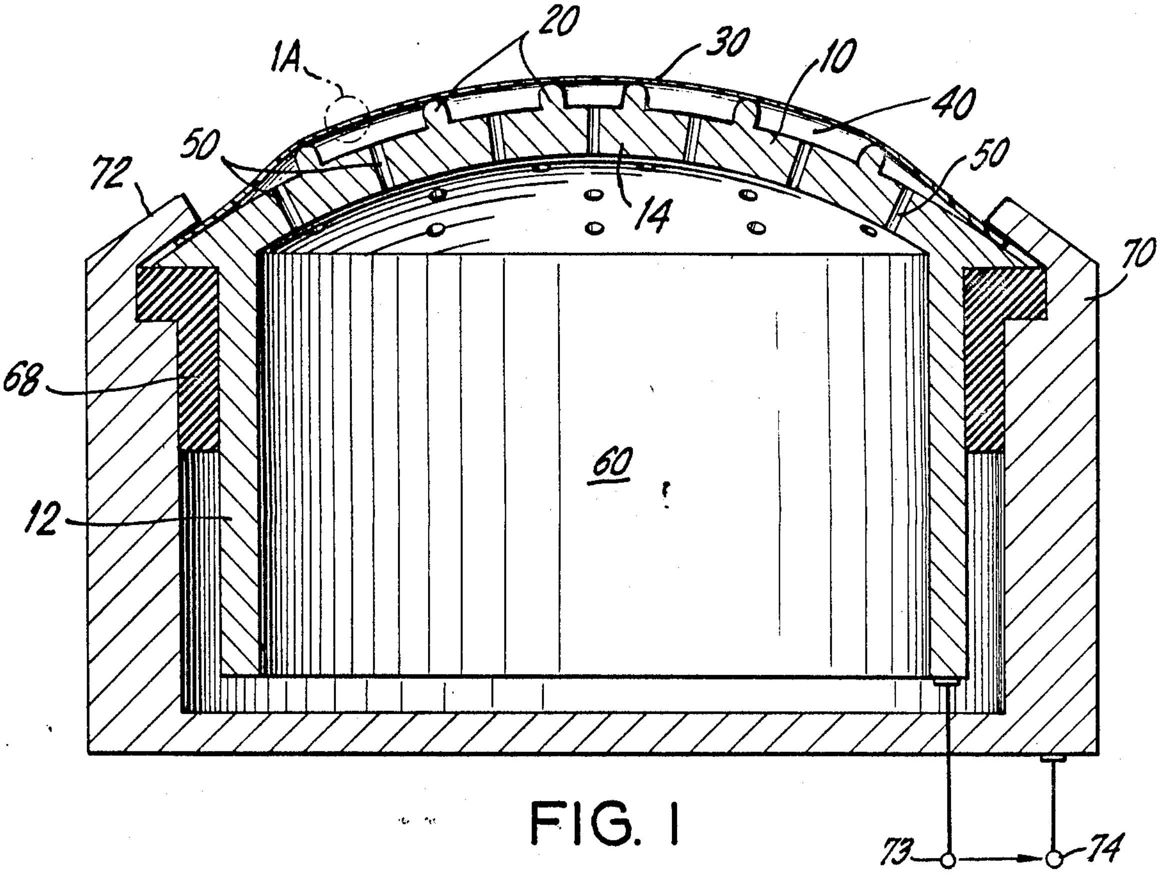
Figure 2:
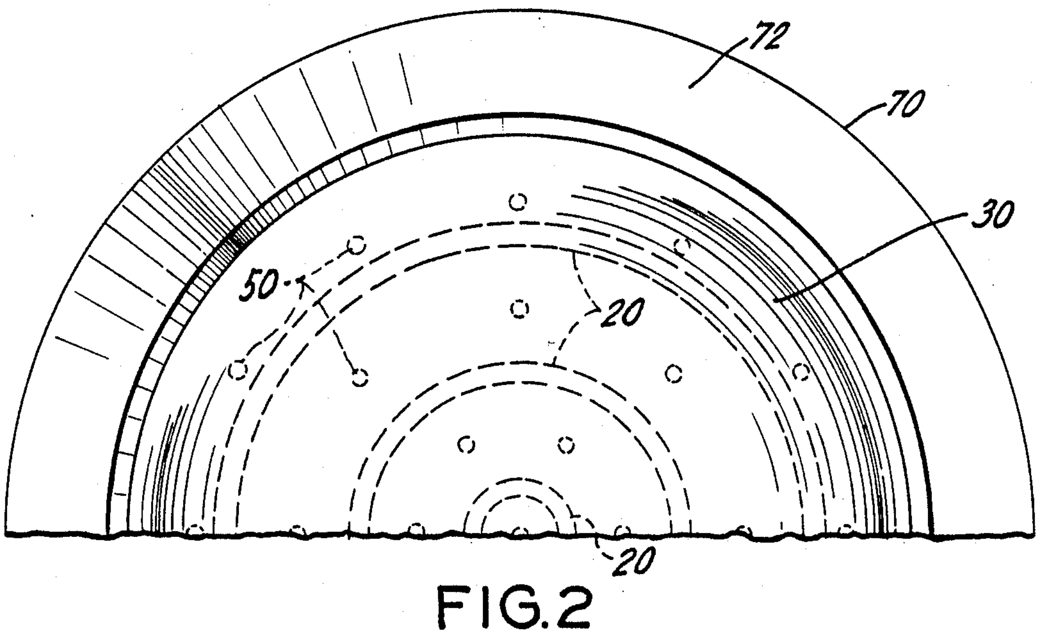
FIG. 2 is a plan view of the transducer in FIG. 1.

In FIGS. 1, 1A and 2, a dome topped foil-supporting holding structure 10 forms an inner electrode and is composed of a metal cylinder 12 topped by a spherical cover 14 on which annular, i.e., ring-shaped, ridges support a membrane 30. The latter is composed of a piezopolymer sheet 32 of polyvinylidenefluoride (PVDF or $PVF_2$) sandwiched between two metallizing layers 34 and 36. Preferably, the membrane 30 is obtained by metallizing the sheet 32. In the drawing, the thicknesses of the metallized layers and the sheet are exaggerated for clarity.

The air volume 40 between the spherical cover 12 and the sheet 30 communicates through bores, capillaries, or holes 50 in the spherical cover 12 with a central volume 60. An elastic insulating sleeve 68 insulates the support 10 from a cylindrically shaped conductive housing 70 that forms a frame. A circular lip 72 on the housing 70 clamps the membrane 30 to the spherical cover 12 of the support 10. By contacting the upper metallizing layer 34, the lip 72 causes the housing 70 to operate as an electrode. Contact by the cover 12 with the lower metallizing layer 36 causes the support 10, which is also conductive, to operate as a second electrode. Suitable terminals 72 and 74 are connected to each of the electrodes.

The lip 72 of the housing 70 clamps the circular edge of the membrane 30 to the support 10 under slight mechanical tension. That is, it stretches the membrane across the ring-shaped supports 20 and assures intimate contact with the annular ridges 20.

The bores 50 which acoustically couple the volume 40 to the rear volume enlarge the coupling volume and generate flow damping.

In operation, the housing 70 which forms the outer electrode is normally grounded through the terminal 74. If the transducer is used as a speaker, an electrical input is applied between the terminals 72 and 74. This electrical input produces a varying electrical field across the sheet 32 and results in corresponding deformations that vibrate the surrounding air.

When the transducer is used as a microphone, vibrations from the surrounding air produce deformations in the membrane 32. This causes a corresponding electrical field that is sensed by the metallizing layers 32 and 34 and appears at the terminals 72 and 74. These voltages can then be sensed and transmitted as necessary.

In FIG. 3 and 3A, a foil 80 of a PVDF membrane 82 metallized with metallizing layers 84 and 86 is clamped at its edges into a conductive microphone housing 90 which contacts the upper metallizing layer 84 and is insulated from the lower metallizing layer 86 by an insulator 92. A conductive rod-shaped support 100 projects through the housing 90 and is insulated from the latter by a cylindrical insulator 110. The support (or rod) 100 raises the center of the membrane 80 so as to tension it and form a tent-like structure. It also contacts the layer 86 and serves as a central electrode. The housing 90 serves as the outer electrode as the result of its contact with the layer 84. A nut 112 engages threads 114 at the bottom of the rod 100 to shift the rod vertically and thus vary the tension in the membrane 80. In this way, it is possible to adjust the tension to that necessary. In production, the sensitivity of the device can be determined and adjusted to conform to comparatively close standards.

In operation as a microphone, vibrations deform the membrane 80 and produce an electric field at the layers 84 and 86. These produce corresponding voltages that appear at two terminals 116 and 118. When used as a speaker, voltages occurring at the terminals 116 and 118 are applied to the metallized layers 84 and 86. The resulting electric field produces deformations in the piezopolymer 82 that result in deformations corresponding to the voltage variations.

According to yet another embodiment of the invention, shown in FIG. 4 and 4A, a structure 120 mounted in a manner similar to the rod 100 of FIG. 3, terminates upwardly in annular ridges corresponding to those of the spherical top 12 of FIG. 1. This results in a shape of the membrane 30 corresponding to that of FIG. 1 but allows for changes in the tension by adjustment of the screw 114. A cover protects the foil 30.

According to other embodiments of the invention, suitable covers protect the foils of FIGS. 1 to 4.

While embodiments of the invention have been described in detail, it will be evident to those skilled in the art, that the invention may be embodied otherwise within its spirit and scope.

What is claimed is:

1. A transducer, comprising:
a piezoelectric membrane including a laminar sheet composed of a piezoelectric material and a pair of conductive electrodes coating the sheet and sandwiching the sheet between them;
said membrane have two surfaces, an edge portion, and a central portion;
support means for supporting said membrane and electrically contacting said membrane at the electrodes;
said support means including a frame for holding the membrane at the edge portion;
said supporting means including a holding structure contacting the membrane at the center portion;
said holding structure contacting said membrane over a first area of the central portion and leaving a larger second area of the central portion of the membrane unsupported;
said holding structure being rigid, and
said frame having means for stretching the membrane over the rigid holding structure so as to give the unsupported portion a curved shape.

2. A transducer as in claim 1, wherein the first area of the central portion is surrounded by the larger unsupported second area of the central portion of the membrane.

3. A transducer, comprising:
a piezoelectric membrane including a laminar sheet composed of a piezopolymer material and a pair of conductive electrodes coating the sheet and sandwiching the sheet between them;
said member having two surfaces, an edge portion, and a central portion;
support means for supporting said membrane and electrically contacting said membrane at the electrodes;
said support means including a frame for holding the membrane at the edge portion;
said support means including a rigid holding structure contacting the membrane at the center portion;
said holding structure contacting said membrane over an area of the central portion and leaving a larger area of the central portion of the membrane unsupported, said frame stretching said membrane over the holding structure so as to give the unsupported portion a curved shape.

4. A transducer as in claim 3, wherein said holding structure contacts the membrane over an area approximating a point near the center of the central portion.

5. A transducer as in claim 3, wherein said holding structure contacts the membrane over an area approximating a line.

6. A transducer as in claim 3, wherein said holding structure contacts the membrane over an area approximating a ring.

7. A transducer as in claim 3, wherein said holding structure contacts the membrane over an area approximating a plurality of concentric rings.

8. A transducer as in claim 3, wherein said holding structure contacts the membrane over an area approximating a plurality of points.

9. A transducer as in claim 3, wherein said holding structure includes a plate having a plurality of ridges contacting the membrane over a plurality of continuous areas, and leave a continuous area larger than the supported area unsupported.

10. A transducer as in claim 4, wherein said holding structure is a rod pushing against the center of the membrane and forming the membrane into the shape of a tent.

11. A transducer as in claim 9, wherein said plate, said ridges, and said membrane form a coupling volume.

12. A transducer as in claim 11, wherein said plate includes means for producing flow damping including a plurality of openings.

13. A transducer as in claim 12, wherein said flow damping means includes porous material forming at least a part of said plate.

14. A transducer as in claim 12, wherein said holding structure includes a cylindrical wall extending from the plate and insulated from the frame for forming a second volume, said flow damping means producing flow damping between said coupling volume and said second volume.

15. A transducer as in claim 13, wherein said holding structure includes a cylindrical wall extending from the plate and insulated from the frame for forming a second volume, said flow damping means producing flow damping between said coupling volume and said second volume.

16. A transducer as in any one of claims 1 to 15, wherein said frame contacts one of the electrodes and is ihsulated from the other of the electrodes, and said holding structure contacts the other of the electrodes and is insulated from the one of the electrodes.

17. A transducer as in any one of claims 1 to 15, wherein said support means includes adjusting means for adjusting tension in the membrane and the tension forms a tent-like structure.

18. A transducer as in claims 3 to 15, wherein said support means includes adjusting means for adjusting the tension in the membrane, said adjusting means being located between said holding structure and said frame for adjusting the position of the holding structure relative to the frame.

19. A transducer as in claim 3, wherein said holding structure includes a material having a temperature coefficient substantially equal to the temperature coefficient of the membrane.

20. A transducer as in claim 3, wherein said sheet is composed of polyvinylidene fluoride.

* * * * *